(12) United States Patent
Chen

(10) Patent No.: US 6,759,267 B2
(45) Date of Patent: Jul. 6, 2004

(54) METHOD FOR FORMING A PHASE CHANGE MEMORY

(75) Inventor: Hsu-Shun Chen, Yunlin (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/197,896

(22) Filed: Jul. 19, 2002

(65) Prior Publication Data

US 2004/0012008 A1 Jan. 22, 2004

(51) Int. Cl.[7] .............................................. H01L 21/00
(52) U.S. Cl. .................... 438/95; 438/254; 438/523; 438/482; 438/485; 438/621; 438/655
(58) Field of Search .................... 438/95, 254, 523, 438/482, 485, 621, 655; 365/163, 148, 218, 168, 212

(56) References Cited

U.S. PATENT DOCUMENTS

| | | |
|---|---|---|
| 3,271,591 A | 9/1966 | Ovshinsky |
| 4,599,705 A | 7/1986 | Holmberg et al. |

Primary Examiner—Eddie Lee
Assistant Examiner—Thomas Magee
(74) Attorney, Agent, or Firm—Finnegan, Henderson, Farabow, Garrett & Dunner, L.L.P.

(57) ABSTRACT

A method of programming a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, and a layer of phase change material provided over at least a portion of the silicide layer, contiguous with the oxide spacer, and over the first diffused region. The method includes electrically coupling the second diffused region of a first memory cell to a first bit line, electrically coupling the first diffused region of the first memory cell to a first word line, electrically coupling the second diffused region of a second memory cell to a second bit line, electrically coupling the first diffused region of the second memory cell to the first word line, electrically coupling the second diffused region of a third memory cell to the first bit line, electrically coupling the first diffused region of the third memory cell to a second word line, electrically coupling the second diffused region of a fourth memory cell to the second bit line, electrically coupling the first diffused region of the fourth memory cell to the second word line, and applying a high voltage pulse to the first word line and second bit line, and a low voltage pulse to the second word line and first bit line.

12 Claims, 3 Drawing Sheets

METHOD FOR FORMING A PHASE CHANGE MEMORY

DESCRIPTION OF THE INVENTION

1. Field of the Invention

This invention pertains in general to a method for fabricating a semiconductor device and, more particularly, to a method for forming a phase change memory device.

2. Background of the Invention

The concept of using electrically erasable phase change materials, i.e., ones that can be electrically switched between amorphous and crystalline states, for a semiconductor memory device is known in the art as described in U.S. Pat. No. 3,271,591. Such phase change materials, for example, chalcogenide materials such as germanium, tellurium and selenium or combinations thereof, are capable of being switched between a first structural state, wherein the materials are generally amorphous, and a second structural state, wherein the materials are generally crystalline. The phase change materials may also be electrically switched between different detectable states from completely amorphous to completely crystalline states and states therebetween. Therefore, the materials may be switched in incremental steps. A phase change material also generally exhibits different electrical characteristics depending upon its state. For instance, the material may exhibit lower electrical resistivity in the crystalline state than in the amorphous state. Such a change in resistivity may be detected with known current sensing schemes, which, in turn, allows for the storage of "data" in the form of logic "0" or "1".

In operation, the phase change material is capable of being transformed from a high resistance state to a low resistance state when a pulse of energy, known as "set pulse", is applied to the material. The energy pulse causes at least a portion of the material to change from an amorphous state to a crystalline state. Additional set pulses may further crystallize the material, thereby decreasing the resistivity of the material.

In U.S. Pat. No. 4,599,705, entitled "Programmable cell for use in Programmable electronic arrays," Holmberg et al., describes a programmable cell for use in programmable electronic arrays, such as PROM devices, logic arrays, gate arrays and die interconnect arrays. The programmable cell incorporates a phase change material having a highly non-conductive state settable and substantially non-resettable into a highly conductive state.

SUMMARY OF THE INVENTION

In accordance with the invention, there is provided a semiconductor device having a first memory cell that includes a substrate, an insulation layer disposed over the substrate, a first polysilicon gate formed over the insulation layer, at least one oxide spacer formed contiguous with one vertical sidewall of the first polysilicon gate, a silicide formed over a horizontal surface of the first polysilicon gate, a first phase change layer formed over a portion of the silicide, contiguous with the oxide spacer, and over a portion of the insulation layer, a first diffused region formed in the substrate, wherein the first phase change layer is formed above the first diffused region, and a second diffused region formed spaced-apart from the first diffused region in the substrate.

In one aspect, the device further includes a second memory cell that shares the second diffused region with the first memory cell.

Also in accordance with the present invention, there is provided a method for manufacturing a semiconductor device having an array of memory cells that includes providing a first transistor having first and second spaced-apart diffused regions, a first polysilicon gate, oxide spacers along vertical sidewalls of the first polysilicon gate, and a first silicide over a horizontal surface of the first polysilicon gate, providing a second transistor having second and third spaced-apart diffused regions, a second polysilicon gate, oxide spacers along vertical sidewalls of the second polysilicon gate, and a second silicide over a horizontal surface of the second polysilicon gate, wherein the first and second transistors share the second diffused region, providing a layer of phase change material over the first and second transistors, and defining and etching the phase change layer to form at least a first and second phase change layers, the first layer providing over the first transistor and the first diffused region, and the second layer providing over the second transistor and the third diffused region.

In one aspect, the method also includes providing an inter-layer dielectric over the first and second phase change layers and the first and second transistors, masking and etching through the inter-layer dielectric and the first and second phase change layers to form a plurality of vias, and filling at least one of the plurality of vias with a conductive material to form at least one plug to electrically connect one of the first and third diffused regions.

In another aspect, the method further includes providing an insulation layer over the inter-layer dielectric and the at least one plug, masking and etching through the insulation layer and inter-layer dielectric to form a second via, filling a conductive material in the second via to electrically connect the second diffused region, and providing an interconnect layer over the second via and the insulation layer.

Further in accordance with the present invention, there is provided a method of programming a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, and a layer of phase change material provided over at least a portion of the silicide layer, contiguous with the oxide spacer, and over the first diffused region. The method includes electrically coupling the second diffused region of a first memory cell to a first bit line, electrically coupling the first diffused region of the first memory cell to a first word line, electrically coupling the second diffused region of a second memory cell to a second bit line, electrically coupling the first diffused region of the second memory cell to the first word line, electrically coupling the second diffused region of a third memory cell to the first bit line, electrically coupling the first diffused region of the third memory cell to a second word line, electrically coupling the second diffused region of a fourth memory cell to the second bit line, electrically coupling the first diffused region of the fourth memory cell to the second word line, and applying a high voltage pulse to the first word line and second bit line, and a low voltage pulse to the second word line and first bit line.

Additionally in accordance with the present invention, there is provided a method of reading a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, a layer of phase change material provided over at least a portion of the silicide layer, contiguous with the oxide spacer, and over the first diffused region. The method includes electrically coupling the second diffused region of a first memory cell to a first bit line, electrically coupling the first diffused region of the first memory cell to a first word line, electrically coupling the second diffused region of a second memory cell to a second bit line, electrically coupling the first diffused region of the second memory cell to the first word line, electrically coupling the second diffused region of a third memory cell to the first bit line, electrically coupling the first diffused region of the third memory cell to a second word line, electrically coupling the second diffused region of a fourth memory cell to the second bit line, electrically coupling the first diffused region of the fourth memory cell to the second word line, and applying a sensing pulse to the first word line.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

Figure 1:
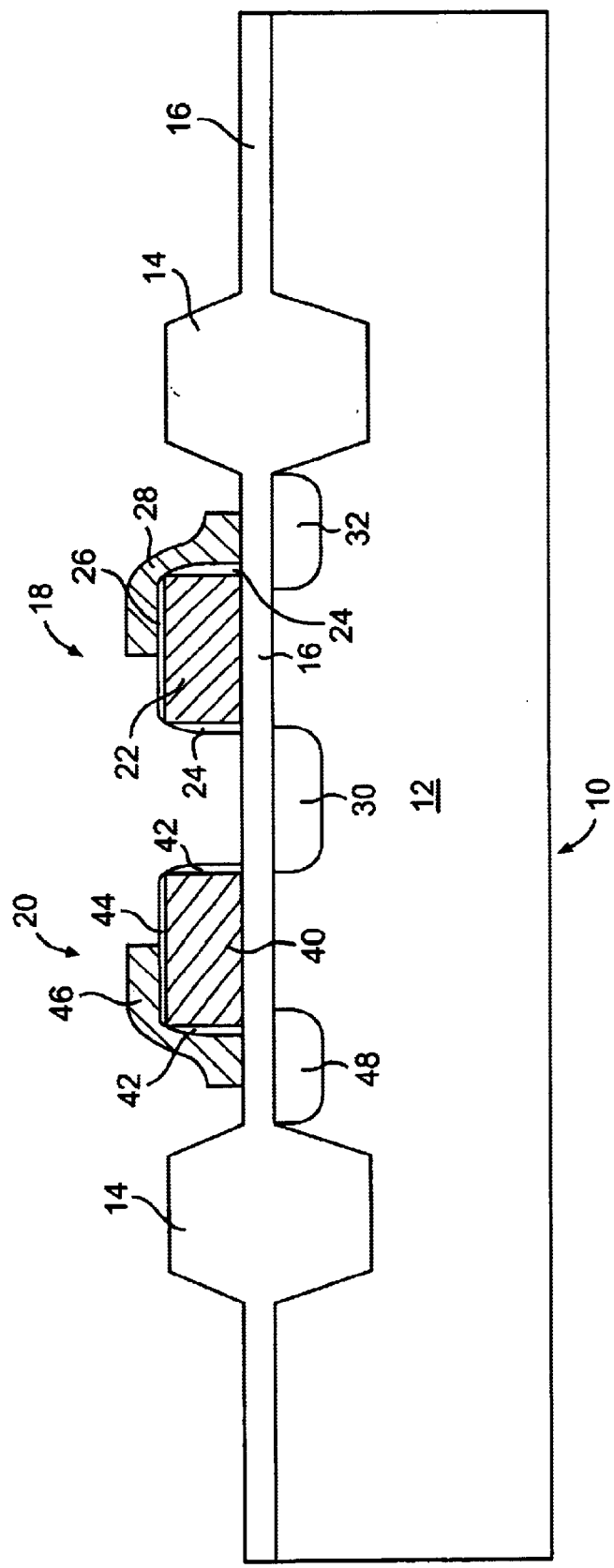
FIG. 1 is a cross-sectional view of a semiconductor device consistent with one embodiment of the present invention.

The present invention provides a non-volatile memory cell having a simple structure and is CMOS process compatible. FIG. 1 is a cross-sectional view of a non-volatile memory device consistent with one embodiment of the present invention. Referring to FIG. 1, a semiconductor device 10 includes a well 12 formed in a substrate (not numbered) and an insulation layer 16 disposed over the substrate. The semiconductor device 10 also includes a plurality of isolation structures 14, such as field oxides, and a plurality of non-volatile memory cells 18 and 20.

The memory cell 18 includes a polysilicon gate 22 formed over the insulation layer 16, and a pair of oxide spacers 24 formed contiguous with each of the vertical sidewalls of the polysilicon gate 22. A silicide 26 is formed over the horizontal surface of the polysilicon gate 22. A phase change layer 28 is formed over a portion of the silicide 26, contiguous with one of the oxide spacers 24, and over a portion of the insulation layer 16. The phase change layer 28 comprises chalcogenide.

The memory cell 18 also includes a first diffused region 32 and a second diffused region 30 formed in the well 12. The phase change layer 28 is formed above the first diffused region 32. In one embodiment, the first diffused region 32 is the drain region and the second diffused region 30 is the source region. In another embodiment, the well 12 is a p-well, and the diffused regions 30 and 32 are n-type regions.

The memory cell 20 is similarly formed and shares the second diffused region 30 with the memory cell 18. The memory cell 20 includes a polysilicon gate 40 formed over the insulation layer 16, and a pair of oxide spacers 42 formed contiguous with each of the vertical sidewalls of the polysilicon gate 40. A silicide 44 is formed over the horizontal surface of the polysilicon gate 40. A phase change layer 46 is formed over a portion of the silicide 44, contiguous with one of the oxide spacers 42, and over a portion of the insulation layer 16. The phase change layer 46 comprises chalcogenide.

The memory cell 20 also includes a third diffused region 48 and a second diffused region 30 formed in the well 12. The phase change layer 46 is formed above the third diffused region 48. In one embodiment, the third diffused region 48 is the drain region and the second diffused region 30 is the source region. In another embodiment, the well 12 is a p-well, and the diffused regions 30 and 48 are n-type regions.

Figure 2A:
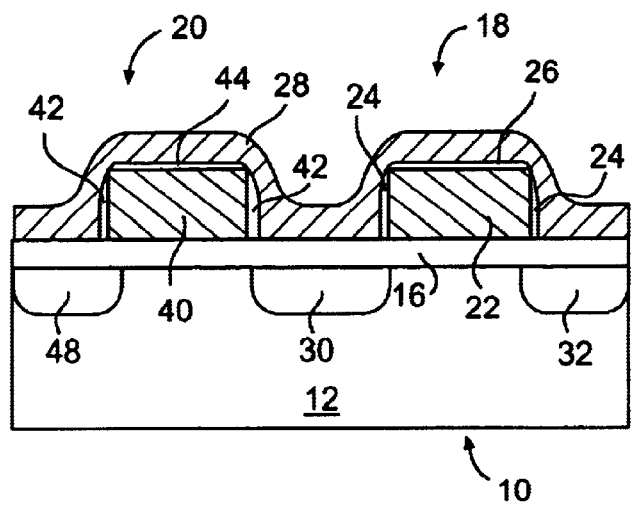
FIGS. 2A–2C are cross-sectional views of the fabrication steps consistent with one embodiment of the present invention.
Figure 2B:
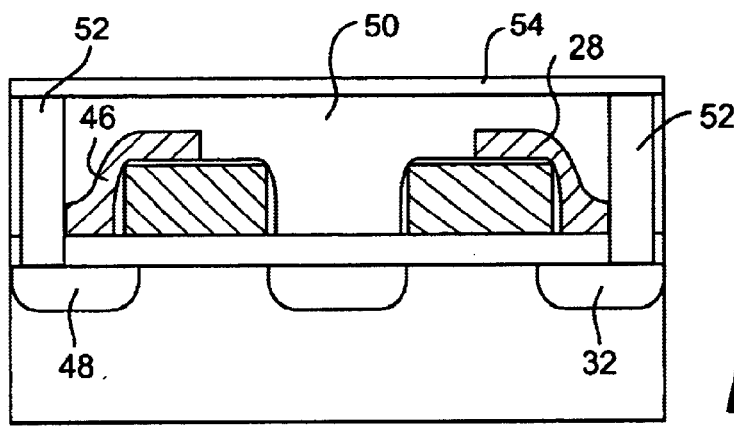
Figure 2C:
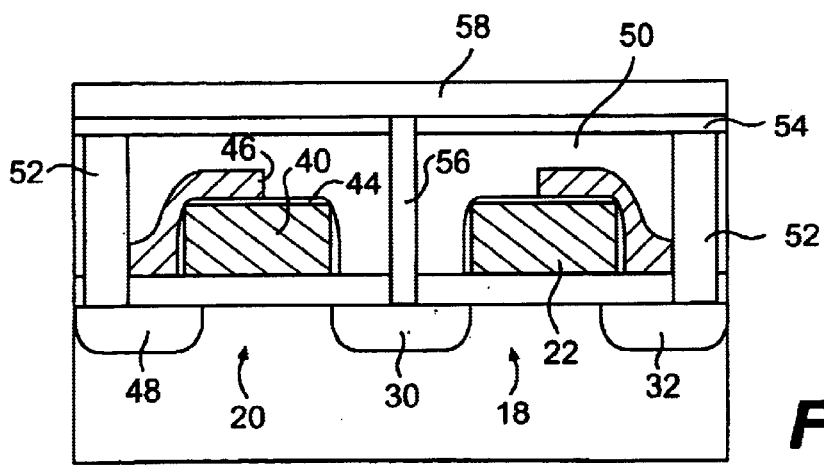

FIGS. 2A–2C are cross-sectional views of the fabrication method consistent with one embodiment of the present invention. Referring to FIG. 2A, a semiconductor device 10 includes two transistors 18 and 20 formed over a semiconductor substrate and an insulating layer 16. The transistor 18 includes spaced-apart diffused regions 30 and 32, polysilicon gate 22, oxide spacers 24 formed along the vertical sidewalls of the polysilicon gate 22, and a silicide 26 formed over the horizontal surface of the polysilicon gate 22. The transistor 20 includes spaced-apart diffused regions 30 and 48, polysilicon gate 40, oxide spacers 42 formed along the vertical sidewalls of the polysilicon gate 40, and a silicide 44 formed over the horizontal surface of the polysilicon gate 40. Each of the components may be formed using conventional CMOS manufacturing processes. As an example, the substrate (not numbered) is first defined. The insulating layer 16 is formed over the substrate. The insulating layer 16 may be composed of silicon dioxide ($SiO_2$). A layer of polysilicon is deposited over the insulating layer 16. A conventional chemical vapor deposition ("CVD") technique may be used to deposit the polysilicon layer. The polysilicon is then defined and etched to form the polysilicon gates 22 and 40. An oxidation step follows to form oxide spacers 24 and 42. An implantation step follows a masking step to form diffused regions 30, 32, and 48. Silicide layers 26 and 44 are then formed.

Referring again to FIG. 2A, a layer of phase change material 28 is then formed over the transistors 18 and 20, and portions of the insulating layer 16. The phase change material 28 comprises chalcogenide, such as $Ge_2Sb_2Te_5$, and is deposited using conventional processes at a thickness of about 20 to 200 nm. The layer of phase change material 28 is then defined and etched, forming the phase change layers 28 and 46 as shown in FIG. 1. As is known, the diffused regions 30, 32 and 48 are the source and drain regions of the transistors 18 and 20, but which diffused region is labeled the source or drain is unimportant.

Referring to FIG. 2B, an inter-layer dielectric ("ILD") 50 is then deposited over the semiconductor device. The ILD 50 is a spin-on-glass ("SOG") material such as phosphosilicate glass ("PSG") and borophosphosilicate glass ("BPSG"). The semiconductor device is then masked and etched through the ILD 50 and phase change layers 28 and 46 to form a plurality of vias (not numbered). The vias are filled with tungsten (W) to form tungsten plugs 52, connecting the diffused regions 32 and 48. A second insulation layer 54 is then provided over the semiconductor device. The second insulation layer 54 may be composed of silicon dioxide ($SiO_2$) having a thickness of approximately 100 nm.

Referring to FIG. 2C, the semiconductor device is again masked and etched through the second insulation layer 54 and ILD 50 to form a via (not numbered). The via is filled with tungsten (W) to form another tungsten plug 56, connecting the diffused region 30. An interconnect layer 58, composed of metallic materials such as aluminum (Al) and copper (Cu), is then provided over the semiconductor device. In one aspect, the interconnect layer 58 is a bit line.

In operation, each of the plugs 52 electrically couples one of the diffused regions and the phase change layer, which may be electrically coupled to the polysilicon gate through the silicide layer depending upon the state of the phase change layer.

Figure 3:
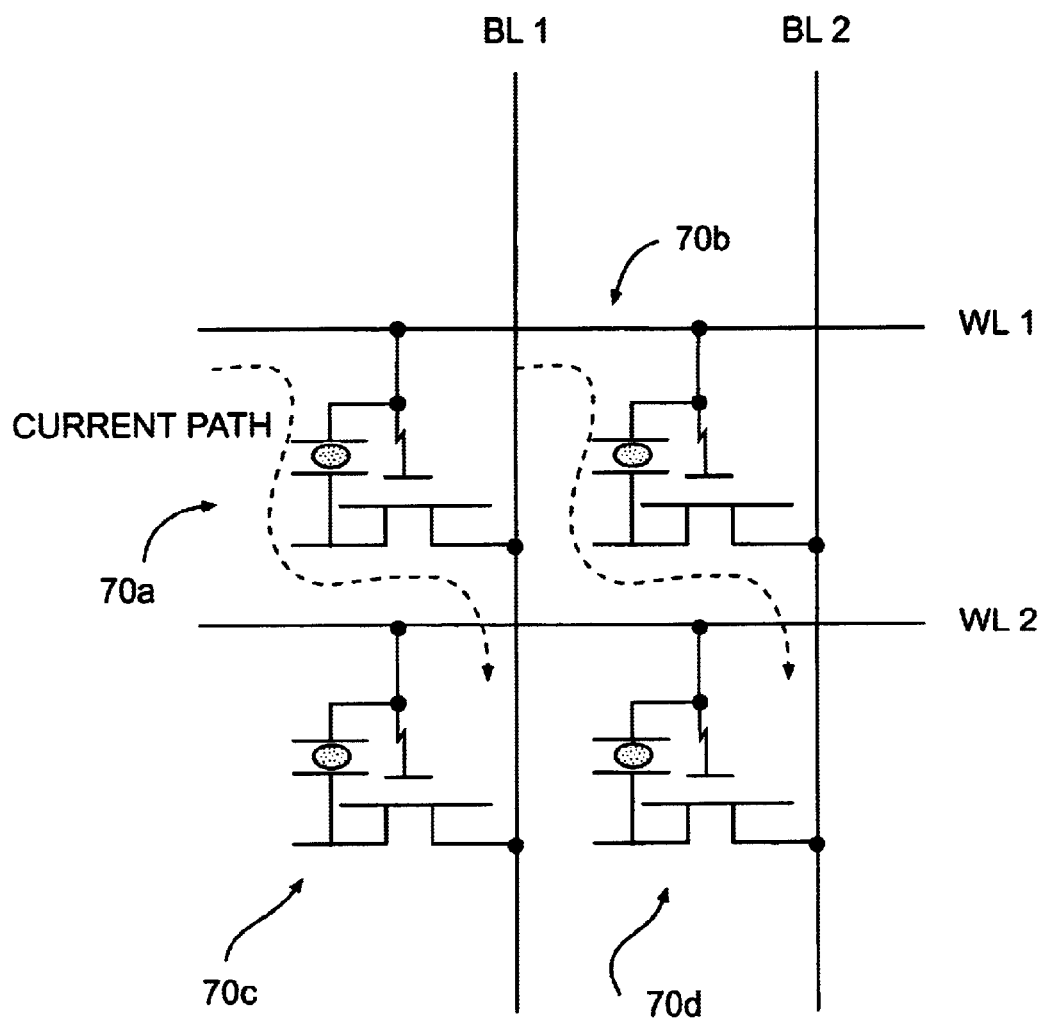
FIG. 3 is a circuit diagram consistent with one embodiment of the present invention.

FIG. 3 is a circuit diagram of a memory array comprising the non-volatile memory cells of the present invention. Referring to FIG. 3, a memory array (not numbered) includes four representative memory cells 70a, 70b, 70c and 70d of the present invention defined by a plurality of substantially parallel word lines, WL1 and WL2, each intersecting a plurality of substantially parallel bit lines BL1 and BL2 at a substantially right angle. Each of the bit lines is coupled to a sense amplifier (not shown) to determine the state, or "data", stored in the array.

Each of the memory cells 70a, 70b, 70c and 70d has the same structure as the memory cell 18 or 20 shown in FIG. 2C. Referring to FIGS. 2C and 3 and assuming the memory cell 70a is the memory cell 20, the diffused region 30 is coupled to BL1, which is the interconnect layer 58, through plug 56. The diffused region 48 is coupled to WL1 through the plug 52. As described earlier, the plug 52 may electrically couple the phase change layer 46, which may be electrically coupled to the polysilicon gate 40 through the silicide layer 44 depending upon the state of the phase change layer 46.

In operation, the memory cell 70a may be programmed by applying a "high" voltage pulse to word line WL1 and bit line BL2, and a "low" voltage pulse to word line WL2 and bit line BL1. For example, the "high" current density for programming is approximately 1 mA to 100 mA per $\mu m^2$. To program a logic "1", the pulse width is approximately 50 ns to 1 $\mu s$, and the pulse width for programming a logic "0" is approximately 1 ns to 50 ns.

The array is erased one row at a time. Therefore, to erase memory cells 70a and 70b, a "high" voltage pulse is applied to word line WL1, and a "low" voltage pulse is applied to word line WL2 and bit lines BL1 and BL2.

During read operation, the principle is similar to conventional sensing schemes in that the resistance of the phase change layer, and therefore the current passing through the layer, is sensed. To read memory cell 70a, the potential on word line WL1 is brought to high, and a sensing current of approximately 0.01 mA to 1 mA per $\mu m^2$ is applied for a period of approximately 1 ns to 100 ns. The voltage difference is sensed by the sense amplifiers (not shown) coupled to the bit lines to identify the resistance.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a semiconductor device having an array of memory cells, comprising:

providing a first transistor having first and second spaced-apart diffused regions, a first polysilicon gate, oxide spacers along vertical sidewalls of the first polysilicon gate, and a first silicide over a horizontal surface of the first polysilicon gate;

providing a second transistor having second and third spaced-apart diffused regions, a second polysilicon gate, oxide spacers along vertical sidewalls of the second polysilicon gate, and a second silicide over a horizontal surface of the second polysilicon gate, wherein the first and second transistors share the second diffused region;

providing a layer of phase change material over the first and second transistors; and defining and etching the phase change layer to form at least a first and second phase change layers, the first layer providing over the first transistor and the first diffused region, and the second layer providing over the second transistor and the third diffused region.

2. The method as claimed in claim 1, further comprising, providing an inter-layer dielectric over the first and second phase change layers and the first and second transistors;

masking and etching through the inter-layer dielectric and the first and second phase change layers to form a plurality of vias; and filling at least one of the plurality of vias with a conductive material to form at least one plug to electrically connect one of the first and third diffused regions.

3. The method as claimed in claim 2, further comprising, providing an insulation layer over the inter-layer dielectric and the at least one plug;

masking and etching through the insulation layer and inter-layer dielectric to form a second via;

filling a conductive material in the second via to electrically connect the second diffused region; and providing an interconnect layer over the second via and the insulation layer.

4. The method as claimed in claim 1, wherein the layer of phase change material comprises $Ge_2Sb_2Te_5$, and has a thickness of about 20 nm to 200 nm.

5. The method as claimed in claim 3, wherein the interconnect layer is a bit line.

6. A method of programming a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, and a layer of phase change material provided over at least a portion of the silicide layer, contiguous with the oxide spacer, and over the first diffused region, comprising:

electrically coupling the second diffused region of a first memory cell to a first bit line;

electrically coupling the first diffused region of the first memory cell to a first word line;

electrically coupling the second diffused region of a second memory cell to a second bit line;

electrically coupling the first diffused region of the second memory cell to the first word line;

electrically coupling the second diffused region of a third memory cell to the first bit line;

electrically coupling the first diffused region of the third memory cell to a second word line;

electrically coupling the second diffused region of a fourth memory cell to the second bit line;

electrically coupling the first diffused region of the fourth memory cell to the second word line; and applying a high voltage pulse to the first word line and second bit line, and a low voltage pulse to the second word line and first bit line.

7. The method as claimed in claim 6, wherein the high voltage pulse has a current density of approximately 1 mA to 100 mA per $\mu m^2$.

8. The method as claimed in claim 6, wherein a logic "1" is programmed with a voltage pulse having a width of approximately 50 ns to 1 $\mu s$.

9. The method as claimed in claim 6, wherein a logic "0" is programmed with a voltage pulse having a width between approximately 1 ns to 50 ns.

10. A method of reading a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, and a layer of phase change material provided over at least a portion of the silicide layer, contiguous with the oxide spacer, and over the first diffused region, comprising:

electrically coupling the second diffused region of a first memory cell to a first bit line;

electrically coupling the first diffused region of the first memory cell to a first word line;

electrically coupling the second diffused region of a second memory cell to a second bit line;

electrically coupling the first diffused region of the second memory cell to the first word line;

electrically coupling the second diffused region of a third memory cell to the first bit line;

electrically coupling the first diffused region of the third memory cell to a second word line;

electrically coupling the second diffused region of a fourth memory cell to the second bit line;

electrically coupling the first diffused region of the fourth memory cell to the second word line; and applying a sensing pulse to the first word line.

11. The method as claimed in claim 10, wherein the sensing pulse has a density of 0.01 mA to 1 mA per $\mu m^2$ and is applied for 1 ns to 100 ns.

12. A method of erasing a first memory cell in an array of at least four memory cells in a semiconductor device, each memory cell including a polysilicon gate, first and second spaced-apart diffused regions, a silicide layer provided over the polysilicon gate, an oxide spacer provided contiguous with a vertical sidewall of the polysilicon gate, and a layer of phase change material provided over at least a portion of the silicide layer, contiguous with the oxide spacer, and over the first diffused region, comprising:

electrically coupling the second diffused region of a first memory cell to a first bit line;

electrically coupling the first diffused region of the first memory cell to a first word line;

electrically coupling the second diffused region of a second memory cell to a second bit line;

electrically coupling the first diffused region of the second memory cell to the first word line;

electrically coupling the second diffused region of a third memory cell to the first bit line;

electrically coupling the first diffused region of the third memory cell to a second word line;

electrically coupling the second diffused region of a fourth memory cell to the second bit line;

electrically coupling the first diffused region of the fourth memory cell to the second word line; and applying a high voltage pulse to the first word line, and a low voltage pulse to the second word line, first bit line, and second bit line.

* * * * *